United States Patent [19]
Watanabe

[11] Patent Number: 5,897,496
[45] Date of Patent: Apr. 27, 1999

[54] METHOD AND APPARATUS FOR PRODUCING MAGNETIC RESONANCE ANGIOGRAM

[75] Inventor: Shigeru Watanabe, Ibaraki-ken, Japan

[73] Assignee: Hitachi Medical Corporation, Japan

[21] Appl. No.: 08/922,269

[22] Filed: Sep. 2, 1997

[30] Foreign Application Priority Data

Sep. 3, 1996 [JP] Japan ................................. 8-232775

[51] Int. Cl.$^6$ .................................................. A61B 5/055
[52] U.S. Cl. ....................... 600/413; 600/419; 600/509; 600/528
[58] Field of Search .................................. 600/413, 419, 600/509, 514, 528

[56] References Cited

U.S. PATENT DOCUMENTS

| | | | |
|---|---|---|---|
| 4,777,957 | 10/1988 | Wehrli et al. | 600/419 |
| 5,251,628 | 10/1993 | Foo | 600/413 |
| 5,329,925 | 7/1994 | Nessaiver | 600/413 |
| 5,477,144 | 12/1995 | Rogers JR. | 600/413 |

*Primary Examiner*—Ruth S. Smith
*Attorney, Agent, or Firm*—Pennie & Edmonds LLP

[57] ABSTRACT

According to the present invention, during performing an MRA sequence comprising a plurality (N) of pulse sequence units each of which gives blood flow a different phase rotation, one sequence unit is repeated a given number (L) of times in every cardiac cycle gated by ECG or pulse wave signals of the object under examination. A measurement of N cardiac cycles, as one round, is repeated to collect data completely filling a k-space for each sequence unit. In this repetition, the order of phase encoding magnetic fields is controlled so that data in the low frequency region of k-space are acquired at the cardiac phase corresponding to the diastolic phase of one cardiac cycle and data in the high frequency region are acquired at the cardiac phase corresponding to the systolic phase. The MRA of the present invention is not likely to be affected by the changes in blood flow caused by heart beats and does not prolong the time for measurement.

17 Claims, 10 Drawing Sheets

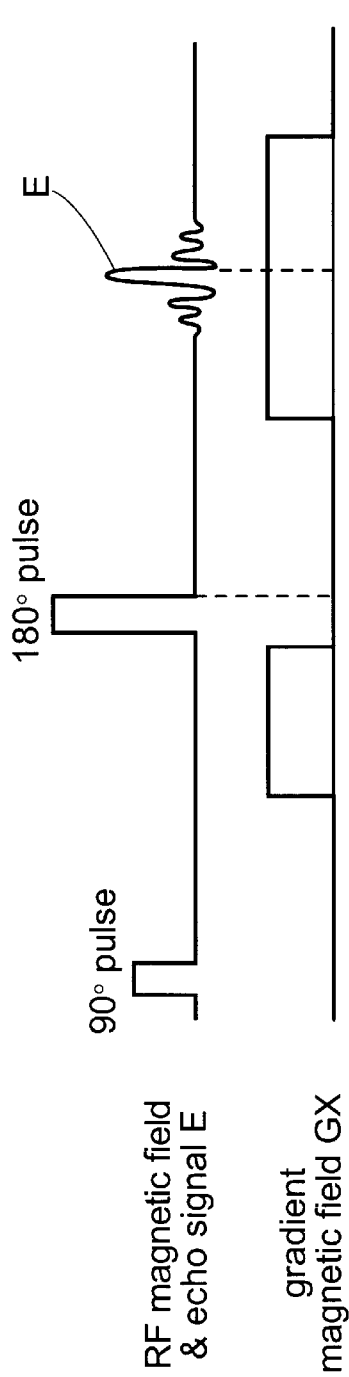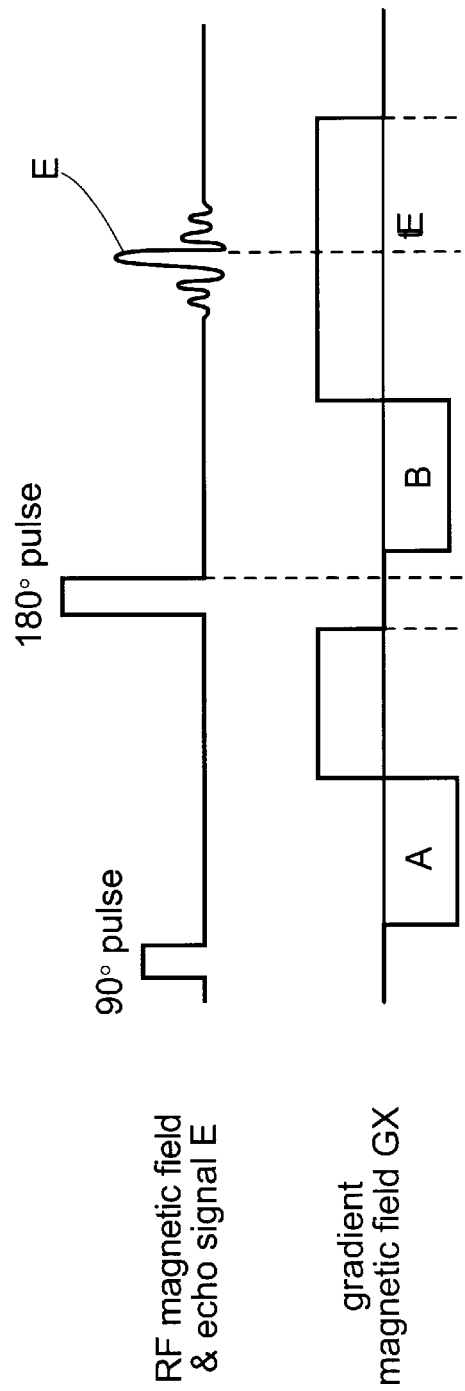

METHOD AND APPARATUS FOR PRODUCING MAGNETIC RESONANCE ANGIOGRAM

BACKGROUND OF THE INVENTION

1. Field of the Invention

The present invention relates to a magnetic resonance imaging (abbreviated as "MRI" hereinafter) apparatus for obtaining tomograms of desired sections of an object to be examined by utilizing nuclear magnetic resonance (abbreviated as "NMR" hereinafter). In particular, it relates to a method for magnetic resonance angiography (referred to as "MRA" hereinafter), which is not likely to be affected by variation in blood flow rate caused by cardiac beat when imaging blood flow in a vascular system, and an apparatus therefor.

2. Related Art

In the MRI, a radio frequency magnetic field is applied to an object to be examined to excite atomic nucleus spins of atoms constituting living tissues of the object, and NMR signals elicited by the spins are acquired to form an image from the spatial distribution of the spins or spectra. When applying the radio frequency magnetic field, gradient magnetic fields are simultaneously applied to impart locational information. The atomic nucleus spins measured in MRI are usually atomic nucleus spins of hydrogen atoms. While the spins of atoms constituting tissues are static, the spins of atoms present in blood flows move. Based on this fact, various blood flow imaging techniques (MRA) using an MRI apparatus have been developed.

Most of such MRA techniques fall in three categories, i.e., the time-of-flight (TOF) method which utilizes the effect of blood inflow into slice planes, the phase-sensitive (PS) method utilizing subtraction of data acquired in the presence and absence of phase diffusion and the phase-contrast (PC) method utilizing subtraction of data acquired in two different conditions where the polarity of phase diffusion caused by blood flow is opposite.

The latter two utilize the fact that moving spins such as in blood flow experience phase modulation relative to their flow rate when the gradient magnetic fields are applied. In the PS method, blood flow imaging is performed by carrying out two kinds of sequences, one for applying gradient magnetic fields so that the phase of moving spins does not coincide with the phase of stationary spins at the timing of signal acquisition (dephase sequence) and another for applying gradient magnetic fields so that the phase of moving spins coincides with the phase of static spins at the timing of signal acquisition (rephase sequence), and using the difference between the data obtained by these sequences. The PC method utilizes a sequence for applying gradient magnetic fields with different polarities (called flow encode gradient magnetic fields) in the direction of blood flow to collect data and uses the difference between the acquired data. In this method, by generating six sequences, data for three axes can be obtained. A technique for obtaining data for three axes by generating four sequences has also been suggested for this method.

It is well-known that the blood flow rate of the vascular system, in particular, the arterial system, changes with the cardiac cycle. This variation in blood flow rate may cause variation in the intensity of the blood flow signal in the MRA measurement. In the PC method and the PS method in particular, the phase of moving spins changes with variation in the blood flow rate, and this leads to changes in the intensity of the differential signals. However, in the conventional methods, the signal acquisition is performed irrespective of the cardiac cycle. Therefore, depending on the cardiac phase when the echo signals are collected and the order of filling the components of the measurement space (space where data are arranged, also called k-space) with acquired data, contrast of the image obtained may change and artifacts may be produced.

Specifically, the phase of the spins is locational information obtained by applying the gradient magnetic fields. It may vary depending on the location in real space (in proportion to the distance from the magnetic field center) and should be inherently constant for each phase encode step. However, the spins of atoms constituting blood flow experience a rotation cyclically varying with the beating of the heart, and the locational information imparted to the blood flow signals therefore varies every encode step. As a result, blood flow signals cannot be formed into an image of one position but appear as artifacts drifting along the phase direction. This problem becomes pronounced particularly in the PC method and the PS method, because the flow encode pulse or dephase pulse for imparting a phase rotation in proportion to the flow rate to the constant flow is applied.

It is known that electrocardiography (ECG) gated measurement is effective for preventing the change of signal strength or artifacts caused by the heart beat. FIG. 10 shows a sequence for the PS method utilizing the ECG-gated measurement. In this sequence, a rephase sequence is repeated within one cardiac cycle and a dephase sequence is repeated within the next cardiac cycle to acquire one set of data for one phase encode step within two cardiac cycles. In this ECG-gated measurement, data for one image are always collected at a fixed cardiac phase and the k-space is filled with data of the same cardiac phase. Accordingly, in the measurement by the sequence shown in FIG. 10, image for each cardiac phase (L images for the first cardiac phase to the Lth cardiac phase) can be obtained and the images are free from nonuniformity of image contrast and artifacts.

However, in this method, measurement for one phase encode step is performed over two cardiac cycles. Therefore, in order to perform J number of encode steps necessary for constituting one image, it is necessary to repeat a sequence over cardiac cycles in a number of twice the number of the phase encode steps (2J). Therefore, supposing that one cardiac cycle is about 1 second and J is 256, one measurement takes about 8.5 minutes (=256×$\frac{2}{60}$). In the PC method, in addition, because one set of data for one phase encoding are obtained by a combination of four or six different sequences, the measurement time is further prolonged. Therefore, it may be practically impossible to utilize the ECG-gated measurement for three-dimensional imaging and hence its application may be limited to two-dimensional imaging.

Accordingly, the object of the present invention is to provide a method for MRA, which can provide stable images while obviating prolonged measurement time.

SUMMARY OF THE INVENTION

In order to achieve the above object, the method for MRA of the present invention is so designed that an image reconstruction is performed by arranging signals measured at each cardiac phase on a k-space taking account of their effects on the image contrast, that is, considering the fact that low frequency data (data of central portion) of the k-space dominate the image contrast and high frequency data (data of peripheral portion) dominate the fine spatial distinction of the image.

According to the MRA method of the present invention, during execution of the MRA imaging sequence, an order of phase encoding gradient magnetic fields applied to every echo signal is controlled by referring to ECG or peripheral pulse wave signals of the object to be examined. By referring to ECG or peripheral pulse wave signals, the signals measured at each time phase within a heart cycle can be phase encoded so as to obtain a desired arrangement of the k-space. For example, a signal obtained at the time when the blood flow rate is the fastest may be arranged in the high frequency region which has less effect on the image contrast and a signal obtained at the time when the blood flow rate is slow may be arranged in the low frequency region which affects the image contrast. Thus, almost all of the signals obtained within one cardiac cycle are utilized for producing one image.

In a preferable embodiment of the present invention, the MRA method is composed of a combination of a plurality (N) of pulse sequence units each of which gives blood flow a different phase rotation and the flow image is obtained through arithmetic operation of data sets in the same number as the number (N) of the sequence units. Specifically, it may be applied to the PC method which detects blood flows in three axial directions by performing six kinds of pulse sequence units, each having a pair of flow encoding pulses for producing phase shifts with a different polarity proportional to the moving velocity of blood along each of three orthogonal directions of gradient magnetic fields, obtaining six data sets and performing an arithmetic operation on each pair of these data sets. It may also be applied to another PC method where blood flows in three axial directions are separately detected by repeatedly performing four kinds of pulse sequence units, each having a different combination of polarities of flow encoding pulses applied along three orthogonal axes, obtaining four data sets and performing an arithmetic operation among these four data sets. It may also be applied to the PS method in which the blood flow is detected by repeatedly performing two kinds of sequence units, one including a flow rephasing gradient magnetic field pulse for giving spins at least one order rephasing in one or more directions of three orthogonal directions and the other including a flow dephasing gradient magnetic field pulse for giving phase dispersion of at least one order in the same direction(s), obtaining two data sets and performing a subtraction between these two data sets.

Both the PC method and the PS method are imaging in which an image is reconstructed by differential signals utilizing the fact that the phase rotation of blood flow differs from that of static spins. Hence, flow artifacts seen on the images can be eliminated by arranging data on k-space taking account of blood flow changes caused by heart beat.

In the MRA method according to the present invention, when the sequence units are executed, the order of applying the phase encoding gradient magnetic field and a data arrangement on k-space are controlled so that low spatial frequency data of k-space are acquired at a time phase corresponding to the diastolic phase and high spatial frequency data of k-space are acquired at a time phase corresponding to the systolic phase gated by trigger signals such as R-wave of ECG or peripheral pulse wave signals.

In the diastolic phase, the blood flow rate is relatively slow. The data acquired in this phase is disposed in a low frequency region of the k-space which is affiliated with image contrast. On the other hand, the data acquired in the systolic phase in which the blood flow rate is relatively fast is disposed in a high frequency region of the k-space which has less effect on the contrast. In this data acquiring method, components having an effect on the contrast of trunk arteries which have a relatively low velocity and include spatially low frequency components are measured as a low velocity blood flow. And components having an effect on the contrast of peripheral arteries which have a relatively high velocity and include spatially high frequency components are measured as a high velocity blood flow. Accordingly, the dynamic range of blood flow rate detection is narrowed and hence the blood flow detection sensitivity can be enhanced.

More specifically, the MRA method according to the present invention, 1) executes the first sequence unit in a given number (L) of steps within a first cardiac cycle while stepping the phase encoding step, the cardiac cycle being defined as the time period between reception of one trigger signal such as R-wave of peripheral pulse wave signals or ECG and reception of the next trigger signal, 2) executes the second sequence unit in the same number of steps within the following second cardiac cycle, 3) executes, if appropriate, other sequences from the $3^{rd}$ to Nth sequence unit sequentially till the end of the Nth cardiac cycle, 4) repeats a cycle from step 1) to step 3) to complete all phase encode steps for all sequence units from the first sequence unit to the Nth sequence unit and 5) acquires data of M cardiac cycles for N of sequence units respectively after the repetition of M cycles to collect phase encoded data of L×M steps for each sequence unit. Here, the order of applying the phase encoding gradient magnetic field and the data arrangement on the k-space are controlled so that low spatial frequency data of k-space are acquired at a time phase corresponding to the diastolic phase and high spatial frequency data of k-space are acquired at a time phase corresponding to the systolic phase.

In this case, if the number (L) of the encoding steps included within one cardiac cycle is defined based on the shortest cardiac cycle length, there will be spare time with regard to the data acquisition time for executing the encode steps (L) due to irregular cardiac cycle length. In a preferred embodiment of the present invention, this spare time is used for acquiring (additional) data of a specific frequency region of k-space. This specific frequency region data is arithmetically averaged with the data of the same frequency region acquired within the normal acquisition time. This improves the signal/noise ratio of the measured data.

BRIEF DESCRIPTION OF DRAWINGS

FIG. 3 shows pulse sequences of the PS method. FIG. 3(a) is a timing chart of a dephase sequence, and FIG. 3(b) is a timing chart of a rephase sequence.

PREFERRED EMBODIMENTS OF THE INVENTION

The present invention will now be explained in detail with reference to the specific examples shown in the appended drawings.

Figure 2:
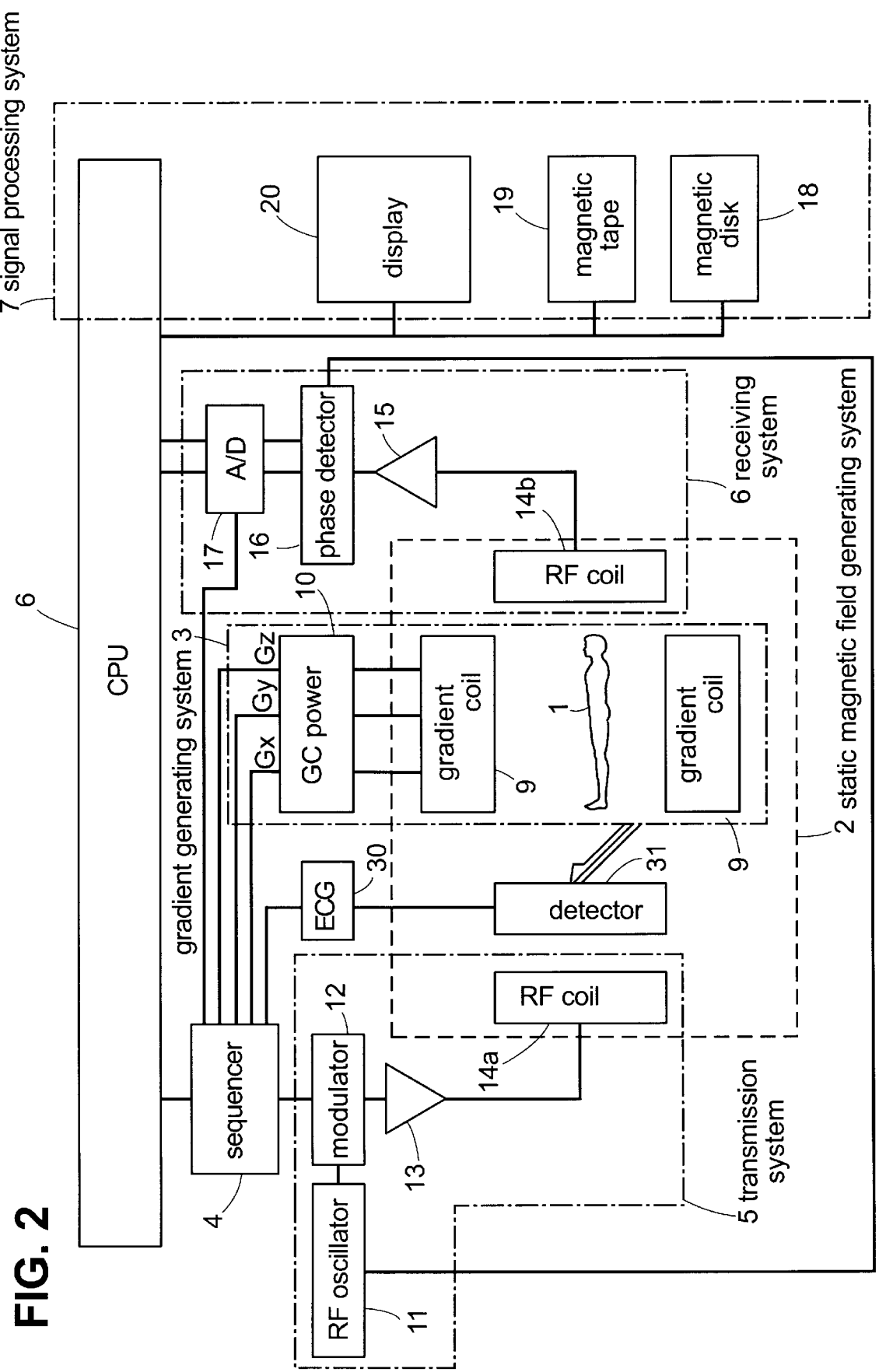
FIG. 2 is an overall block diagram representing a system of the MRI apparatus of the present invention.

FIG. 2 is an overall block diagram showing the system of an MRI apparatus that can be used according to the present invention. This MRI apparatus is for obtaining tomograms of an object to be examined by utilizing nuclear magnetic resonance (NMR), and essentially consists of a static magnetic field generating system 2, a gradient magnetic field generating system 3, a transmission system 5, a receiving system 6, a signal processing system 7, a sequencer 4 and a central processing unit (CPU) 8.

The static magnetic field generating system 2 generates a uniform static magnetic field around an object to be examined 1 in a direction parallel or perpendicular to the body axis of the object 1 and comprises a magnet for generating the static magnetic field in a space around the object 1. The magnet may be a permanent magnet, a resistive magnet or a superconductive magnet.

The gradient magnetic field generating system 3 consists of gradient magnetic field coils 9 coiled in the directions of three axes, X, Y and Z, and a gradient magnetic field power supply 10 for driving the gradient magnetic field coils. The gradient magnetic field power supply 10 is driven according to instructions from the sequencer 4 and applies gradient magnetic fields Gx, Gy and Gz in the directions of the three axes, X, Y and Z, to the object 1. A slice plane of the object 1 is determined by selecting the magnitudes of these gradient magnetic fields. In the MRA imaging of the present invention, the gradient magnetic field coils generate flow encoding pulses for giving blood flow phase rotations in a given axis direction.

The sequencer 4 is for repeatedly applying RF pulses in a given pulse sequence to cause nuclear magnetic resonance of nuclei of atoms constituting the living body tissues of the object 1. The sequencer 4 operates under the control of the CPU 8, and transmits various kinds of instructions necessary for collecting data for obtaining tomograms of the object 1 to the transmission system 5, the gradient magnetic field generating system 3 and the receiving system 6. According to the present invention, the sequencer 4 generates an MRA sequence such as for the TOF method, PC method, PS method or the like.

The transmission system 5 is for producing a radio frequency magnetic field in order to cause nuclear magnetic resonance of nuclei of atoms constituting the living body tissues of the object 1 in accordance with the radio frequency pulse transmitted from the sequencer 4, and consists of a high frequency oscillator 11, a modulator 12, a high frequency amplifier 13 and a radio frequency coil for transmission 14a. The transmission system 5 amplitude-modulates the radio frequency pulses output from the high frequency oscillator 11 by the modulator 12 in accordance with instructions from the sequencer 4. The amplitude-modulated radio frequency pulses are amplified by the high frequency amplifier 13 and supplied to the radio frequency coil 14a placed in the vicinity of the object 1 so that electromagnetic waves are radiated onto the object 1.

The receiving system 6 is for detecting echo signals (NMR signals) elicited through nuclear magnetic resonance of atomic nuclei of the living body tissues of the object 1, and consists of a radio frequency coil 14b for receiving electromagnetic waves, an amplifier 15 and a quadrature phase detector 16 and an A/D transducer 17. Electromagnetic waves (NMR signals) emitted from the object 1 in response to the electromagnetic waves irradiated from the radio frequency coil 14a for transmission are detected by the radio frequency coil 14b placed in the vicinity of the object 1, input into the A/D transducer 17 through the amplifier 15 and the quadrature phase detector 16 and thereby converted into digital signals. The sampling data obtained at the quadrature phase detector 16 with timings instructed by the sequencer 4 are collected as two series data and transferred to the signal processing system 7.

The signal processing system 7 consists of the CPU 8, a recording medium such as a magnetic disk 18 and magnetic tape 19 and a display unit 20 such as a CRT. The CPU 8 performs processings such as Fourier transform, calculation of correction coefficient and image reconstruction, thereby imaging a signal intensity distribution or distribution obtained by subjecting a plurality of signals to suitable arithmetic operations on a certain section and displaying them as a tomogram on the display unit 20.

In FIG. 2, the radio frequency coils 14a and 14b for transmission and receiving and the gradient magnetic field coils 9 are placed within the magnetic field formed by the static magnetic field generating magnet 2 arranged in the space around the object to be examined 1.

The system is further provided with an electrocardiograph 30 which transmits necessary wave data or trigger signals to the sequencer 4 based on the electrocardiogram detected by a detector 31 installed on the object. The sequencer 4 generates the MRA sequence upon receiving the data or the trigger signals from the electrocardiograph 30 and controls the phase encoding step with reference to the cardiac phase information.

The MRA method using the above-mentioned apparatus of the present invention will be explained hereinafter. As the MRA sequence, anyone of the known sequences such as that of the TOF method, PC method, PS method or the like may be employed. Here, an exemplary sequence employs the most efficient and simple PS method.

Figure 1:
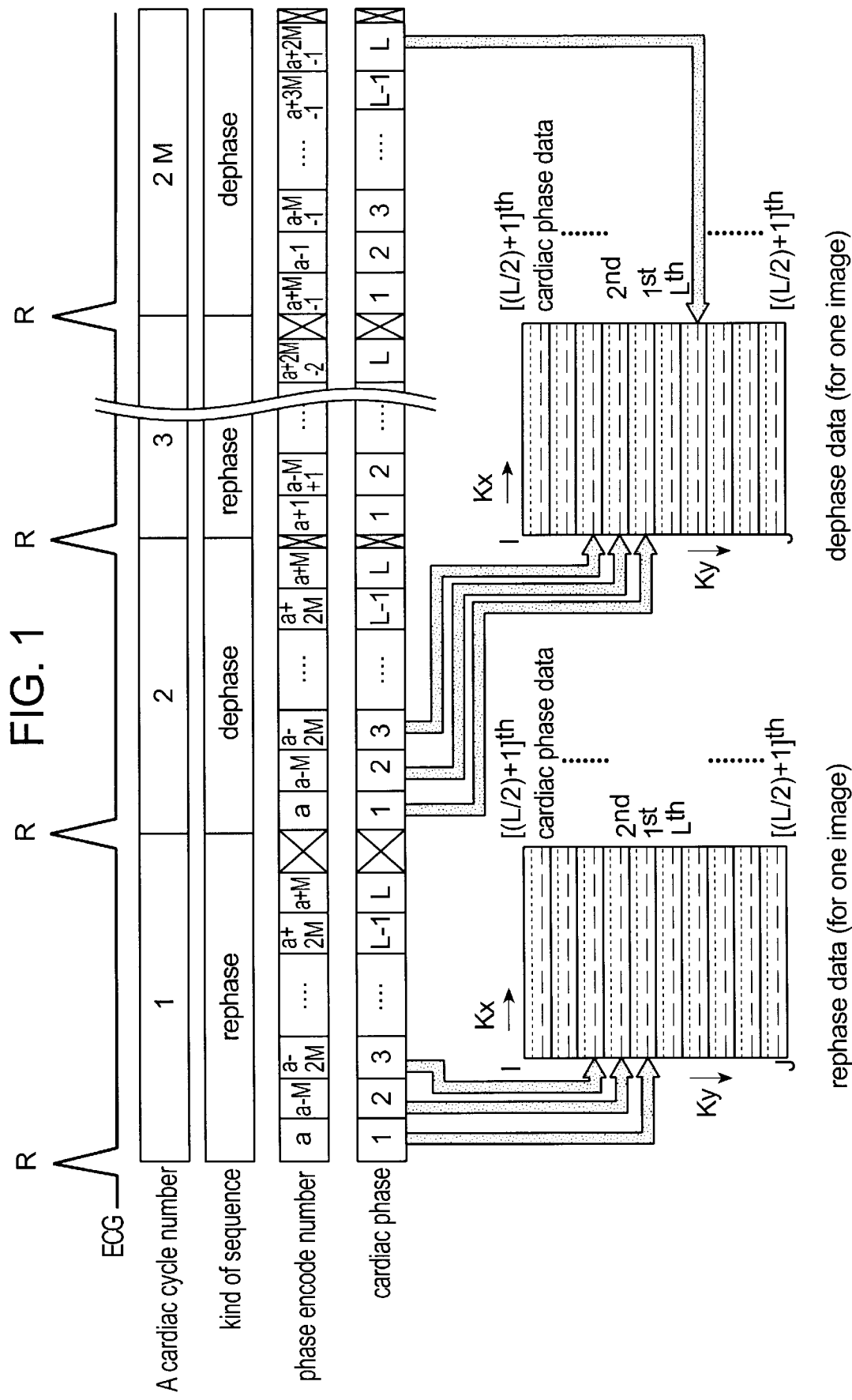
FIG. 1 is a timing chart representing an exemplary PC method MRA imaging pulse sequence and a data arrangement on a k-space according to the present invention.

FIG. 1 is a timing chart representing the exemplary MRA pulse sequence of the PS method and a data arrangement on a k-space according to the present invention. In the figure, ECG represents an electrocardiogram and in this embodiment, two kinds of sequences, a rephase sequence and a dephase sequence, are performed triggered by R-wave from the electrocardiograph 30.

The dephase sequence is a sequence in which a readout gradient is applied, for example, as shown in FIG. 3(a) so that the phase of moving spins does not coincide with that of stationary spins at the time of acquisition of echo signal E. On the other hand, the rephase sequence is a sequence in which the phase of moving spins coincides with that of stationary spins at the peak of echo signal E by applying additional readout gradient magnetic fields A and B with a negative polarity as shown in FIG. 3(b). Signals from the stationary part have the same intensity in the rephase sequence and the dephase sequence, whereas signals obtained from the region where moving magnetization is present have a higher intensity in the rephase sequence than in the dephase sequence, since signal loss due to phase diffusion is suppressed in the rephase sequence.

Figure 4:
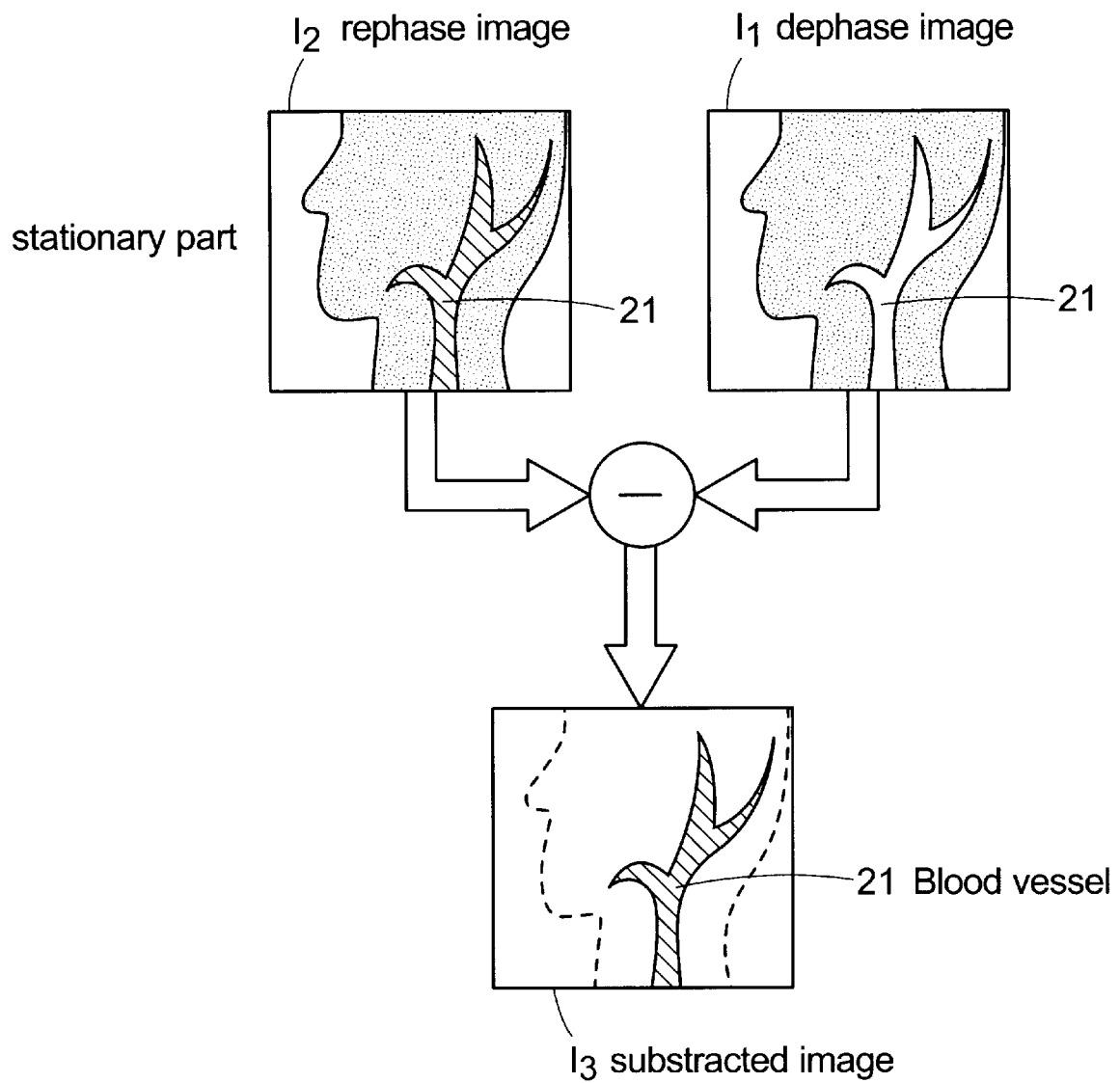
FIG. 4 is a schematic view of image reconstruction according to the PS method.

Accordingly, as shown in FIG. 4, the moving part 21 such as blood flow in the vessel can be visualized as a subtraction image I3 which is formed using the difference between the dephase image I1 obtained by the dephase sequence and the rephase image I2 obtained by the rephase sequence. Though the spin echo method is exemplified as a sequence for acquiring echo signals in FIGS. 3(a) and (b), it maybe the gradient echo (GE) method which does not require radiation of a 180 degree pulse and is preferable because the echo signals can be measured in a short period of time.

In the FIGS. 3(a) and (b), gradient magnetic fields for phase encoding the echo signals are not shown for simplicity but these sequences include the phase encoding gradient with a different magnitude in every repetition.

In the MRA sequence of the present invention, these two kinds sequence units are repeatedly performed a number of times equal to the given number of the phase encoding steps within a cardiac cycle respectively and the kind of sequence unit is altered every cardiac cycle. Specifically, upon starting the MRA sequence, the first sequence unit, i.e., the rephase sequence, is executed within the first cardiac cycle from receiving of the first R-wave to receiving of the next trigger signal. This rephase sequence is repeated a number of times equal to a given number of steps, for example, L times, while stepping the phase encode in accord with the cardiac phase. In the ensuing second cardiac cycle, the second sequence unit, that is, the dephase sequence, is executed with the same phase encode steps as the rephase sequence to collect data of the same cardiac phase. One round of these two cardiac cycle measurements is repeated to obtain data of a number of matrices (number of data in ky direction of k-space) desired for reconstruction of one image. Supposing that the number of matrices is J and the number of cardiac phases (number of steps in one cardiac cycle) is L, the number of repetitions M will be M=J/L. Since one round consists of two cardiac cycles, measurement of 2M cardiac cycles in total should be performed.

In this case, the value [a] found by the following equation is used as an initial value for the phase encode step and the sequence is repeated while reducing the phase encode value by M steps every cardiac cycle.

$$a=[(J-M)/2]+1$$

Among the thus phase encoded signals, data obtained at times from 1 to $\{(L/2)+1\}$ of the cardiac phase are disposed successively from lower frequency region to higher frequency region on the k-space and data obtained at times from $\{(L/2)+1\}$ to L of the cardiac phase are disposed from higher frequency region to lower frequency region.

In the next cardiac cycle, the dephase sequence is repeated in the same phase encoding manner and acquired data are disposed on the k-space similarly. At the end of one measurement round of two sequences, the phase encode is stepped by one and a similar measurement is repeated to fill the k-space with acquired data completely.

This phase encode stepping method enables the last diastole data,, which has a relatively slow flow rate among the acquired data within one cardiac cycle, to be disposed in the low frequency region which affects the image contrast and the systole data with a high flow rate to be disposed in the high frequency region.

Figure 5:
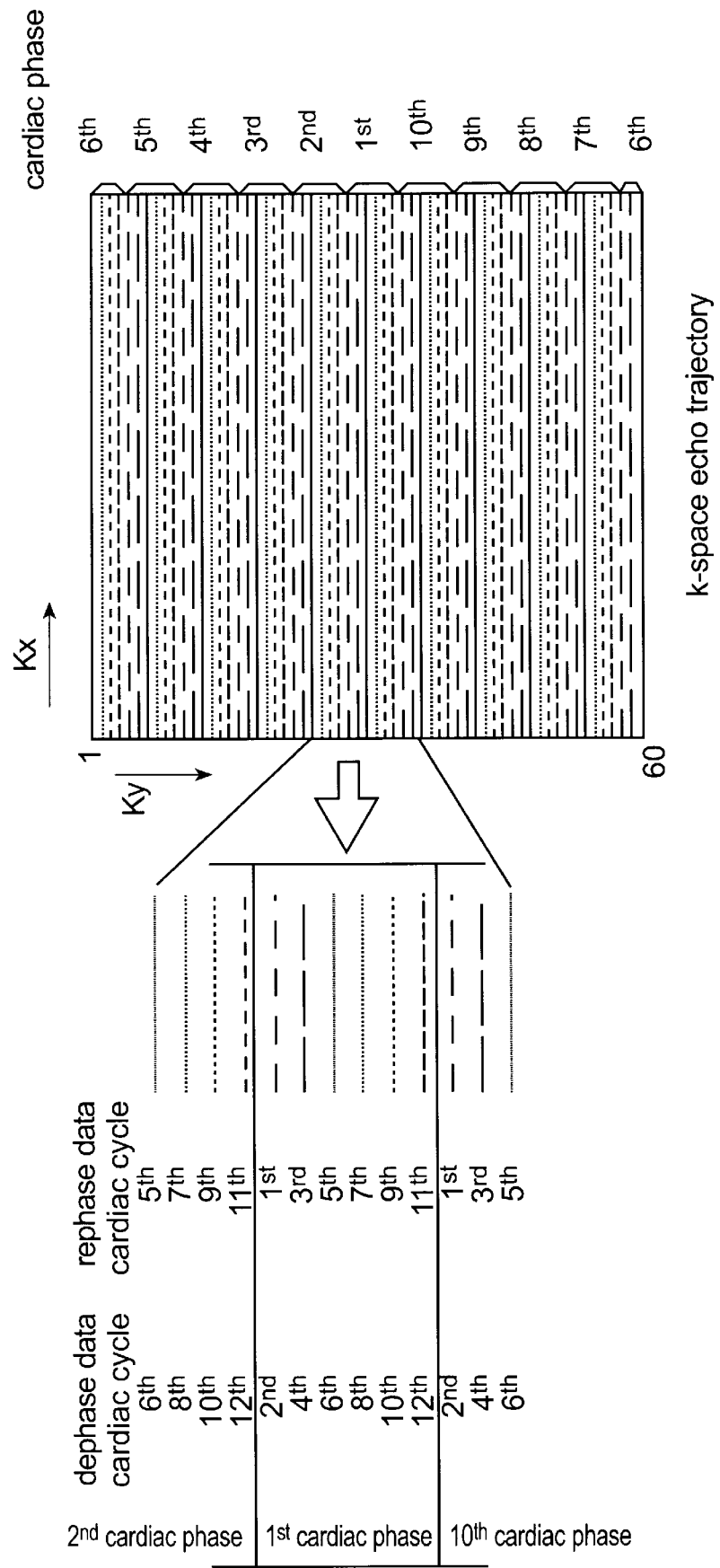
FIG. 5 shows a data arrangement on a k-space according to the present invention.

FIG. 5 shows data collected in a six-round measurement (M=6), that is, 12 cardiac cycle measurements which collect data of 10 cardiac phases(L=10) per one cardiac cycle. In this measurement, 60(L×M) phase encoded data can be obtained for rephase and dephase sequences respectively. This means that complete data for forming one image (having a spatial resolving power of 60 matrices in the phase encoding direction) of the same slice for rephase and dephase are obtained.

Though the acquired data are arranged on the k-space so that the data from first to sixth cardiac phase are disposed upward from the center of a k-space in the ky direction (vertical direction) and the data from sixth to tenth cardiac phase are disposed upward from the bottom to the center and that the cycle number of the cardiac cycle increases downward within one cardiac phase data array in FIG. 5, either of a cardiac phase order and a cardiac cycle order may be reversed to obtain a similar effect. In the reversed manner, the data from first to sixth cardiac phase may be disposed downward from the center, the data from sixth to tenth cardiac phase may be disposed downward from the top to the center and the cycle number of the cardiac cycle increases upward within one cardiac phase data array.

FIG. 5 shows the case where the number of the phase encode steps is 60 for simplicity. In actual measurement, a power of 2 is often employed as the number of the phase encode steps. In case the number of steps is 256, for example, 256 phase encode step data for each of rephase and dephase can be obtained by collecting data of 32 cardiac phases/cardiac cycle for 16 cardiac cycles (8 rounds). Here, supposing that one cardiac cycle takes one second (the number of heart beats=60 BPM), two dimensional PS-MR angiogram is produced in 16 seconds. Therefore, even a three dimensional MR angiogram can be obtained in a practical time.

The signal processor 7 performs a reconstruction operation using two acquired data sets, precisely, a subtraction of the complex number region (amplitude and phase) to form an image I3 of blood flow alone of the examined object as shown in FIG. 4. The intensity of each pixel of this image reflects the velocity of the blood flow at the position.

It has been explained in the above examples that R-wave of ECG is utilized as the source of the gating signal referred to upon starting the MRA sequence. Alternatively, the signal may be a pulse wave signal, cardiac sound or any other signal which carries heart beat information.

It has been also explained in the above examples that the same number of cardiac phase data are measured in every cardiac cycle. However, cardiac phase data should be measured within 80 to 90% of the length of the cardiac cycle because the lengths of the cardiac cycles are not usually constant (regular) and spare time should be secured in order to attain an exactly synchronized measurement with the cardiac cycle. By securing the spare time, the time of starting the sequence can be made precisely coincident with a cardiac phase which determines the time of measurement for every cardiac cycle.

However, since the morphology of the subject to be examined does not change corresponding to the cardiac phase but only the flow rate thereof varies, the cardiac phase which determines the time of measurement does not have to be exactly the same time for every cardiac cycle. It may have a time lag of 30 ms or less and the effect thereof on the image is negligible.

When the rephase/dephase sequences shown in FIG. 1 employ the GE method and are performed with a short repetition time TR, excitation by RF should be repeated at constant intervals in order to keep the steady state. In this case, it is impossible to run the pulse sequence precisely synchronized with the cardiac phase. However, a time lag in the range of 30 ms or less is permissible as mentioned above and, in addition, the time lag in that case will be less than 30 ms since TR is not more than 30 ms. Therefore, variation in flow rate in this time period is negligibly small.

Figure 6:
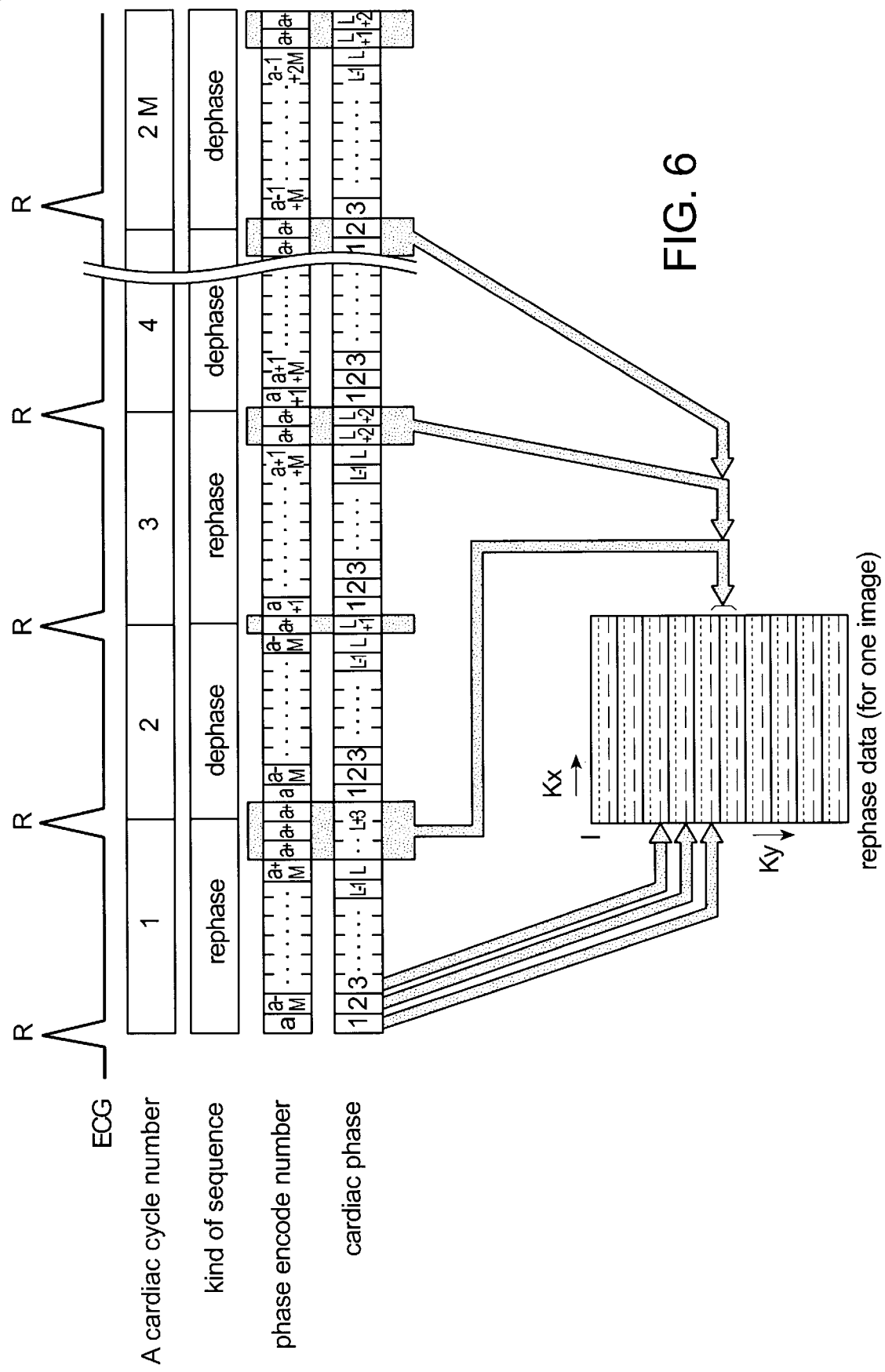
FIG. 6 is a timing chart representing another exemplary MRA imaging pulse sequence and a data arrangement on a k-space according to the present invention.

Excitation by RF may be continued during the spare time produced owing to variation among the cardiac cycles in order to keep the steady state and the data acquired within the spare time can be used for an addition. This is exemplified in FIG. 6, where the sequence unit is continuously repeated after an acquisition of data for a given number (L) of time phases till the next trigger signal is detected. In the figure, data acquisition is performed three times after the normal rephase measurement for L cardiac phases in the first cardiac cycle and data acquisition is performed once after the dephase measurement for L cardiac phases in the second cardiac cycle. Further, in the third and Mth cardiac cycles, data acquisition is performed twice after the normal measurement.

In this case, the phase encode step(s) for the spare time measurement is preferably a phase encode step [a*] (any of between [a] and [a+M]) in a low frequency region. The data acquired in the spare time are used for processing, such as calculation of an arithmetic mean with data of the same phase encode normally acquired at the prior or posterior time phase (1 or L). Thus, the S/N of the image is improved.

When the data are added, the numbers of data arrays used for the processing are preferably identical through the overall sequence so that rephase data and dephase data are balanced. In the example shown in the figure, only one of three data acquired in the spare time of the first cardiac cycle is used so as to make the numbers of data identical in all cycles.

Though the MRA imaging of the present invention has been explained with reference to an example employing the PS method, it is also similarly applicable to the PC method.

Figure 7:
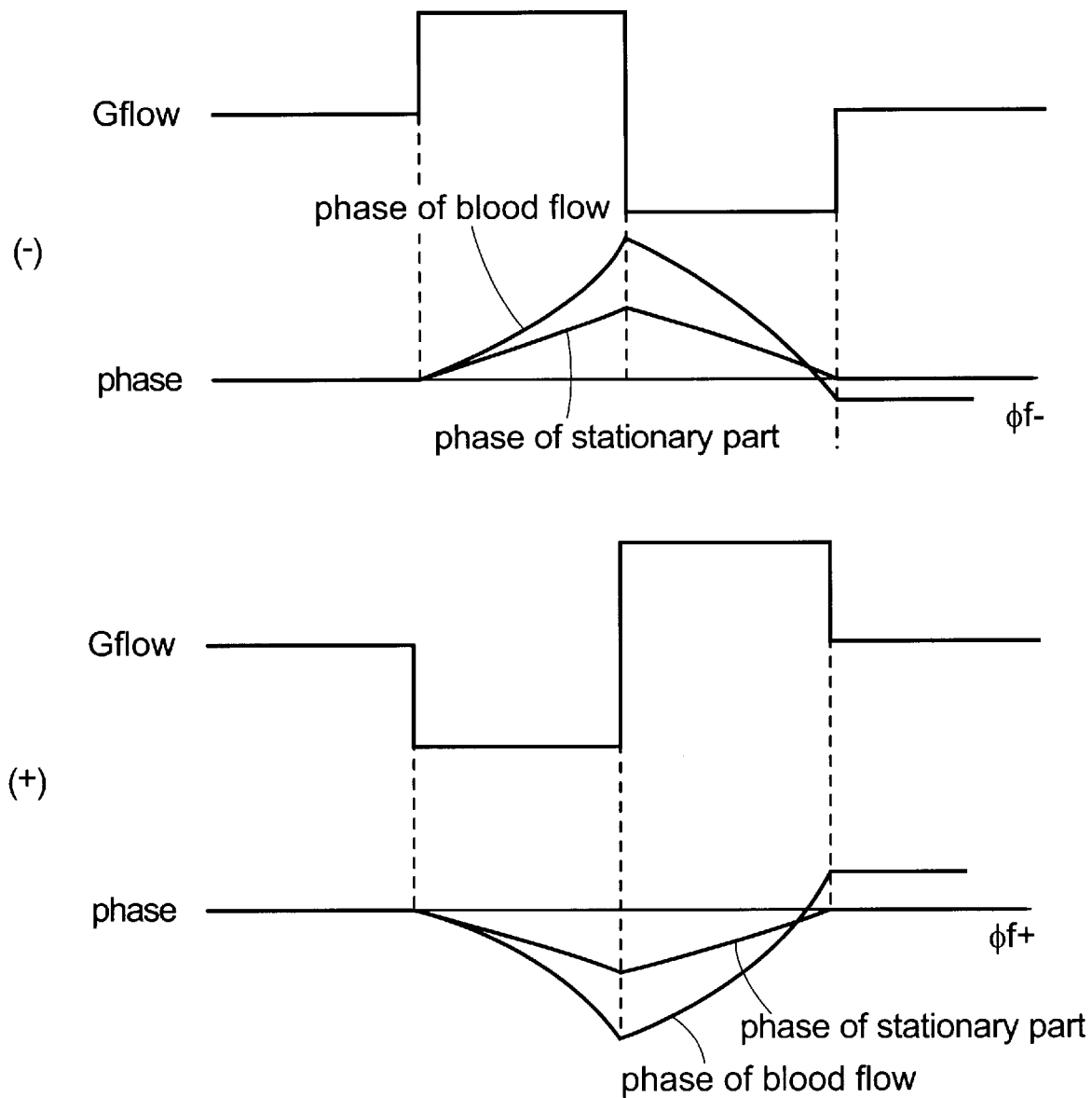
FIG. 7 is an application pattern of flow encoding pulses according to the PC method.
Figure 8:
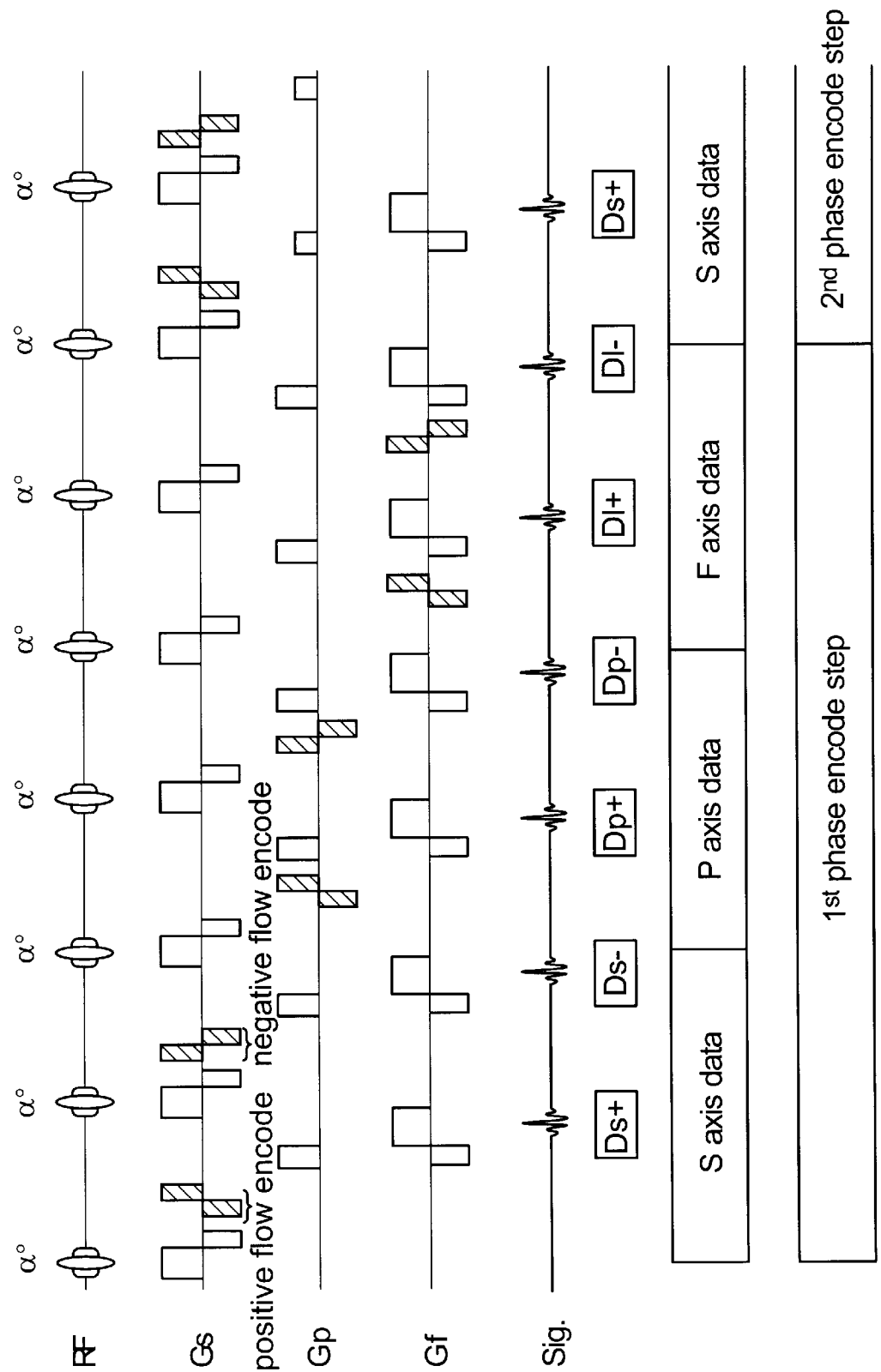
FIG. 8 is a timing chart schematically representing a six-measurement pulse sequence employed in the PC method.

As well known by the artisan, in the PC method, a pair of gradient magnetic fields with an opposite polarity shown in FIG. 7, called a flow encode pulse, is applied. Spins of blood flow experience a phase rotation $\phi f+$ or $\phi f-$ relative to the flow velocity depending on the order of two magnetic fields. Therefore, signals only from blood flow can be detected by applying two kinds of flow encode pulses with a different polarity alternately and using the difference between two acquired data sets to null the signals from a stationary part which has not experienced a phase rotation. Here, the intensity of the acquired signals varies depending on the velocity and becomes maximum when the velocity is such that the difference of phases $\phi f+$ and $\phi f-$ is $\pi$. An image of blood flow along one axis can be obtained by performing a sequence including a positive flow encode pulse (+) and another sequence including a negative flow encode pulse (-) in the direction of that axis and conducting a subtraction operation on the acquired data. This process is carried for all three axes, that is, six kinds of sequences as shown in FIG. 8 are performed to visualize blood flows of all directions.

When the imaging of the present invention is applied to the PC method where the six sequences are operated, a sequence unit, one of the six sequences, is repeated a given number (L) of times within a cardiac cycle and L data for each sequence are obtained at the end of six cardiac cycles when all kinds of sequences have been executed. One round consisting of six cardiac cycle measurements is repeated M times and M×6 cycle measurements in total are performed to obtain six sets of data. Among these data sets, two data sets which are obtained by using a pair of flow encode pulses with opposite polarity in the same axis direction are subtracted to obtain blood flow data for the axis.

In this case also, the phase encoding method at each time phase is the exactly same as in the PS method shown in FIG. 1. That is, data acquired at the first cardiac phase is disposed in the center of k-space and data of the second, third ... cardiac phases are disposed subsequently upward or downward in the ky direction so that data of the Lth cardiac phase finally returns to the vicinity of the center. In this manner, the last diastole data with a relatively slow flow rate is disposed in the low frequency region which affects the image contrast and the systole data with a high flow rate is disposed in the high frequency region.

Figure 9:
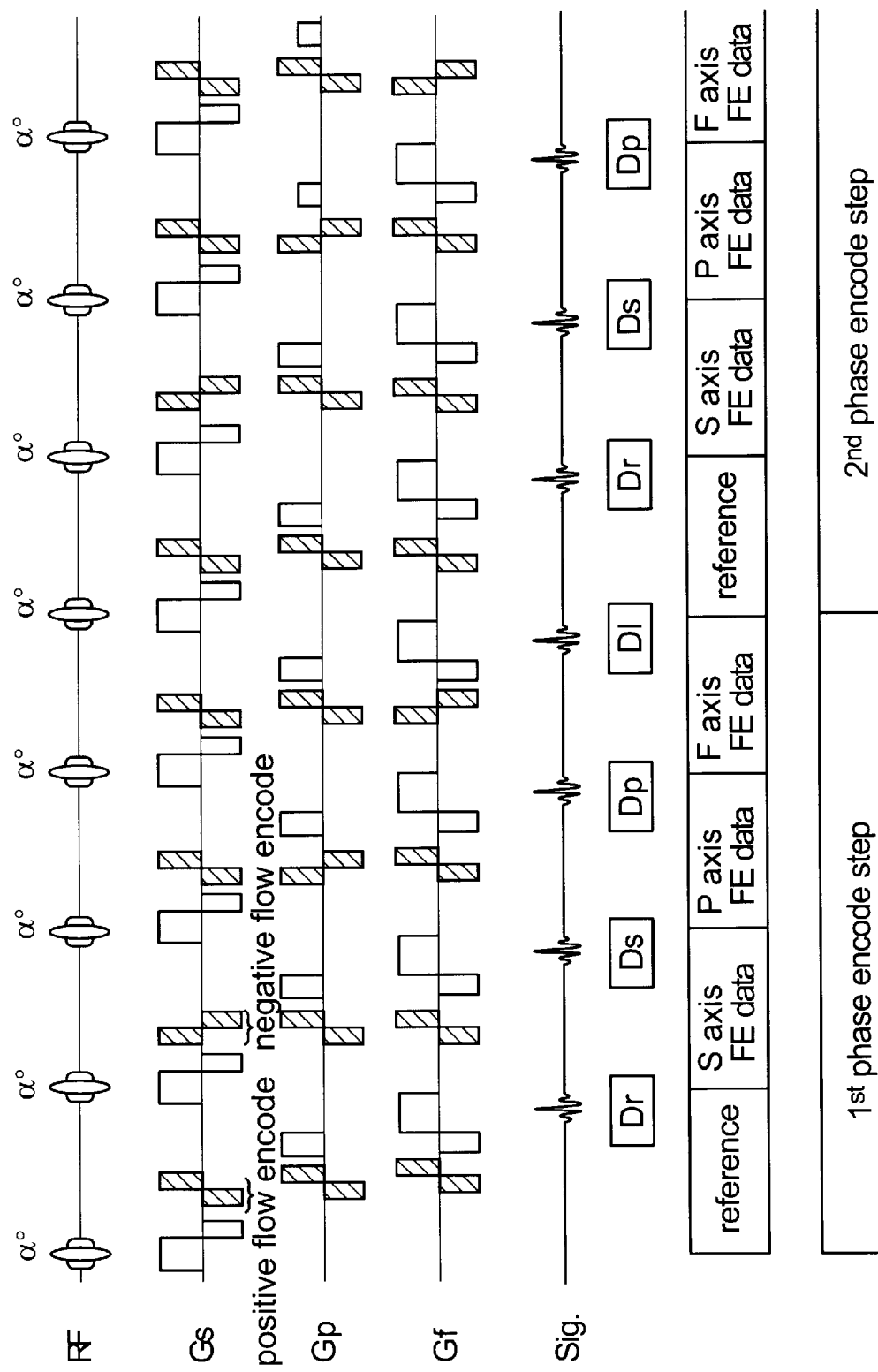
FIG. 9 is a timing chart schematically representing a four-measurement pulse sequence employed in the PC method.
Figure 10:
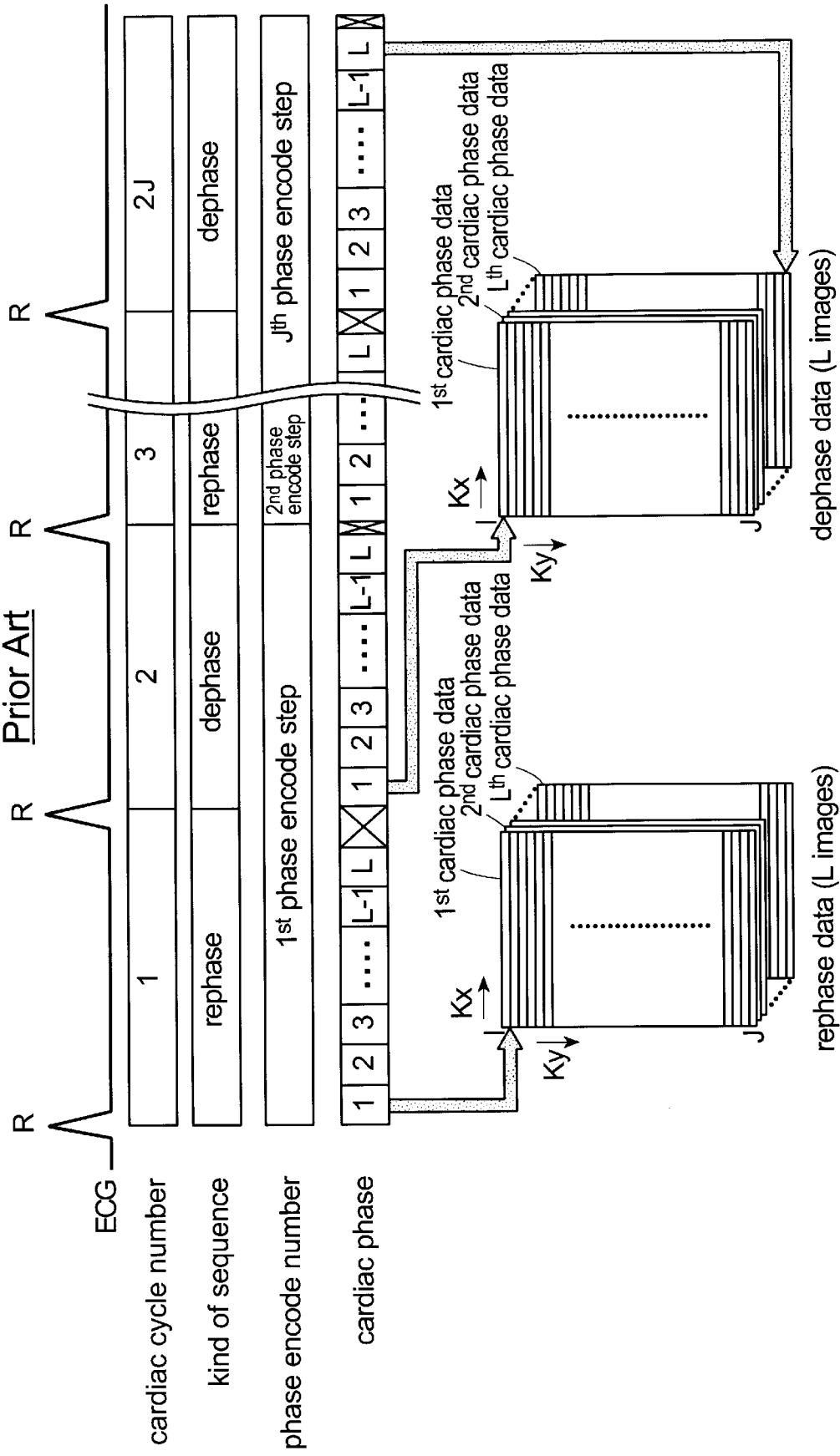
FIG. 10 is an overall timing chart schematically representing a conventional pulse sequence of ECG-gated MRA imaging.

The PC method may be composed of a combination of one reference sequence and three negative flow encode sequences each corresponding to three axes (four sequences in total) as shown in FIG. 9 to detect the blood flow in three axial directions. The MRA method of the present invention can be applied to this PC method in a same manner as the above mentioned PC method using 6 sequence units, except that the number of the sequence units is different.

In this case, one round consisting of four cardiac cycle measurements is repeated M times to perform M×4 cardiac cycle measurements and four data sets are obtained. Among these data sets, data acquired by the reference sequence and the data acquired by each flow encode sequence for each axis are subtracted to obtain blood flow data for each axis.

Supposing that the time duration of a cardiac cycle is approximately one second and the number of cycles is 8, it takes 48 seconds or 32 seconds to form a two dimensional angiogram by the PC method including 4 sequence units or that including 6 sequence units respectively.

A short time lag in synchronizing may be also permissible as in the PS method and data acquired in the spare time can be also used for adding.

According to the present invention, in an MRA measurement including an application of gradient magnetic fields for phase encoding blood flow spins, the order of applying the phase encoding gradient magnetic fields to each of the echo signals is controlled with reference to ECG or pulse waves of the object under examination. Thereby all of the data acquired within one cardiac cycle are utilized for reconstruction of one image without extending the measurement time and, in addition, flow artifacts can be suppressed. Also the MRA method of the present invention covers a wide range of flow velocities and improves the performance of forming a blood flow image. Specifically, a two dimensional measurement can be accomplished with a measurement time of 20 seconds or less in the PS method and 40 seconds or less in the PC method.

Though the above mentioned advantages are obtained when the present invention is applied to the PC method or PS method, both of which include application of gradient magnetic fields for phase encoding blood flow spins, it may be applied to the other MR angiography such as the TOF method and, in that case, an image only slightly affected by heart beats can be obtained.

I claim:
1. A method for obtaining magnetic resonance angiogram comprising the steps of:
   1) detecting specific time phases successively by measuring ECG signals generated by an object to be examined;
   2) executing a first pulse sequence repeatedly to collect echo signals elicited from the object within a period from the detection of a first specific time phase to the detection of a second specific time phase such that phase encode value is changed sequentially from a lower spatial frequency region of k-space to a higher spatial frequency region in time phases from early systole to diastole of cardiac cycle of the object and then is changed sequentially from the high spatial frequency region to the low spatial frequency region in time phases from diastole to late diastole;

3) executing a second pulse sequence repeatedly to collect echo signals elicited from the object within a period from the detection of the second specific time phase to the detection of a third specific time phase such that phase encode value is changed sequentially from a lower spatial frequency region of k-space to a higher spatial frequency region in the time phases from early systole to diastole of cardiac cycle of the object and then is changed sequentially from the high spatial frequency region to the low spatial frequency region in the time phases from diastole to late diastole;

4) repeating a plurality of cycles from step 1) to step 3) while stepping phase encode values both in the lower spatial frequency region and the higher spatial frequency region respectively to obtain a set of echo signals for image reconstruction of one image for both the first pulse sequence and the second pulse sequence;

5) reconstructing a couple of images using the echo signals obtained from the first pulse sequence and those from the second pulse sequence respectively; and 6) performing subtraction of the image from the first pulse sequence and the image from the second pulse sequence.

2. The method for obtaining magnetic resonance angiogram of claim 1, wherein, provided that the number of the cycles required for collecting echo signals for reconstructing a single image is M, phase encoding order during a pulse sequence executed between one specific time phase and the next specific time phase is controlled such that the phase encode value is incremented successively by M in the time phases from the beginning of systole to the diastole and the phase encode value is reduced successively by M in the time phases from the diastole to the late diastole.

3. The method for obtaining magnetic resonance angiogram of claim 1, wherein the first pulse sequence is a rephase sequence in which the phase of stationary spins of the object coincides with the phase of moving spins at the peak of an echo signal, and the second pulse sequence is a dephase sequence in which the phase of stationary spins of the object does not coincide with the phase of moving spins at the peak of an echo signal.

4. The method for obtaining magnetic resonance angiogram of claim 1, wherein the first pulse sequence is a sequence including an application of a flow encode gradient magnetic field of positive polarity in at least one direction corresponding to blood flow and the second pulse sequence is a sequence including an application of a flow encode gradient magnetic field of negative polarity in at least one direction corresponding to blood flow.

5. The method for obtaining magnetic resonance angiogram of claim 4, wherein the first pulse sequence and the second pulse sequence are performed for two or more directions.

6. The method for obtaining magnetic resonance claim 1 further comprising the steps of:

7) measuring the shortest interval between adjacent R waves detected as a specific time phase of ECG signal and determining number of repetition of the pulse sequences performed during the interval;

8) provided that there is spare time for executing the first pulse sequence or the second pulse sequence after executing the determined number of the pulse sequence before the next R wave, repeatedly executing the pulse sequences in which the phase encode values are low and the same as those of the executed pulse sequences; and 9) taking an arithmetic mean of the echo signals of the same phase encode value.

7. A method for obtaining magnetic resonance angiogram comprising the steps of:

1) executing circularly plural kinds of pulse sequences triggered by a biological signal generated periodically from an object to be examined at a different period and obtaining echo signals from the object for each pulse sequence, wherein one pulse sequence is repeated during one period and the phase encode is stepped sequentially from a low spatial frequency value to a high spatial frequency value and then stepped sequentially from the high spatial frequency value to the low spatial frequency value such that data of a low spatial frequency region of k-space are acquired while the blood velocity of the object is slower and data of a high spatial frequency region of k-space are acquired while the blood velocity of the object is faster; and 2) performing arithmetic operation on the echo signals obtained by the execution of each kind of the pulse sequences.

8. The method for obtaining magnetic resonance angiogram of claim 7, wherein the biological signal is an ECG signal.

9. The method for obtaining magnetic resonance angiogram of claim 7, wherein the biological signal is a heart pulse wave signal.

10. The method for obtaining magnetic resonance angiogram of claim 7, wherein the biological signal is a heart sound signal.

11. An apparatus for obtaining magnetic resonance angiogram comprising:

detecting means for detecting specific time phases successively by measuring ECG signals generated by an object to be examined, first means for collecting echo signals elicited from the object by executing a first pulse sequence repeatedly within a period from the detection of a first specific time phase to the detection of a second specific time phase such that phase encode value is changed sequentially from a lower spatial frequency region of k-space to a higher spatial frequency region in time phases from early systole to diastole of cardiac cycle of the object and then is changed sequentially from the high spatial frequency region to the low spatial frequency region in time phases from diastole to late diastole, second means for collecting echo signals elicited from the object by executing a second pulse sequence repeatedly within a period from the detection of the second specific time phase to the detection of a third specific time phase such that phase encode value is changed sequentially from a lower spatial frequency region of k-space to a higher spatial frequency region in the time phases from early systole to diastole of cardiac cycle of the object and then is changed sequentially from the high spatial frequency region to the low spatial frequency region in the time phases from diastole to late diastole, means for operating the first and the second means such that a plurality of cycles consisting of measurement using the first means and the following measurement using the second means are repeated while stepping phase encode values both in the lower spatial frequency region and the higher spatial frequency region respectively to obtain a set of echo signals for image reconstruction of one image for both the first pulse sequence and the second pulse sequence, means for reconstructing a couple of images using the echo signals obtained from the first pulse sequence and those from the second pulse sequence respectively, and means for performing subtraction of the image from the first pulse sequence and the image from the second pulse sequence.

12. The apparatus for obtaining magnetic resonance angiogram of claim 11 further comprising:

means for controlling a phase encoding order during execution of pulse sequences from one specific time phase to the next specific time phase such that, provided that the number of the cycles required for collecting echo signals for reconstructing a single image is M, the phase encode value is incremented successively by M in the time phases from the beginning of systole to the diastole and the phase encode value is reduced successively by M in the time phases from the diastole to the late diastole.

13. The apparatus for obtaining magnetic resonance angiogram of claim 11, wherein the first pulse sequence is a rephase sequence in which the phase of stationary spins of the object coincides with the phase of moving spins at the peak of an echo signal and the second pulse sequence is a dephase sequence in which the phase of stationary spins of the object does not coincide with the phase of moving spins at the peak of an echo signal.

14. The apparatus for obtaining magnetic resonance angiogram of claim 11, wherein the first pulse sequence is a sequence including an application of a flow encode gradient magnetic field of positive polarity in at least one direction corresponding to blood flow and the second pulse sequence is a sequence including an application of a flow encode gradient magnetic field of negative polarity in at least one direction corresponding to blood flow.

15. The apparatus for obtaining magnetic resonance angiogram of claim 14 further comprising:

means for performing the first pulse sequence and the second pulse sequence for two or more directions.

16. The apparatus for obtaining magnetic resonance angiogram of claim 11 further comprising:

means for measuring the shortest interval between adjacent R waves detected as a specific time phase of the ECG signal and determining number of repetition of the pulse sequences performed during the interval, means for repeatedly executing the pulse sequences in which the phase encode values are low and the same as those of the executed pulse sequences in a possible spare time for executing the first pulse sequence or the second pulse sequence after executing the determined number of the pulse sequences before the next R wave, and means for taking an arithmetic mean of the echo signals of the same phase encode value.

17. An apparatus for obtaining magnetic resonance angiogram comprising:

means for executing circularly plural kinds of pulse sequences triggered by a biological signal generated periodically from an object to be examined at a different period and obtaining echo signals from the object for each pulse sequence, wherein one pulse sequence is repeated during one period and the phase encode is stepped sequentially from a low spatial frequency value to a high spatial frequency value and then is stepped sequentially from the high spatial frequency value to the low spatial frequency value such that the data of low spatial frequency region of k-space are acquired while blood velocity of the object is slower and data of high spatial frequency region of k-space are acquired while blood velocity of the object is higher, and means for performing arithmetic operation on the echo signals obtained by the execution of each kind of pulse sequences.

* * * * *